United States Patent [19]

Tanaka et al.

[11] 4,396,940

[45] Aug. 2, 1983

[54] COLOR ORIGINAL EVALUATING METHOD

[75] Inventors: Akihiko Tanaka, Sagamihara; Yasuo Kubota, Tokyo, both of Japan

[73] Assignee: Dai Nippon Insatsu Kabushiki Kaisha, Tokyo, Japan

[21] Appl. No.: 279,939

[22] Filed: Jul. 2, 1981

[30] Foreign Application Priority Data

Jul. 7, 1980 [JP] Japan ................... 55-92414

[51] Int. Cl.³ ..................... H04N 9/535; H04N 3/00
[52] U.S. Cl. ..................................................... 358/80
[58] Field of Search .................. 358/75, 78, 79, 80, 358/55; 5/451

[56] References Cited

U.S. PATENT DOCUMENTS 4,158,859  6/1979  Kerbel .......................... 358/75 X

OTHER PUBLICATIONS

Photogrammetric Engineering, vol. 40, No. 2, pp. 199–202, Feb. 1974.

*Primary Examiner*—Robert L. Richardson
*Attorney, Agent, or Firm*—Koda and Androlia

[57] ABSTRACT

In a color original evaluating method, the image of a printing color original is projected, as a two-valued image at a set slice level, onto the screen of a monitor, the slice level is changed to select a region proposed for a highlight set point as a color separation condition from the area and position of the white portion of the color original. Slice levels are obtained for red, green and blue with the areas of white portions in the use of red, green and blue filters being in an allowable limit, and are employed as reference densities at highlight set points of these colors, respectively, and a density distribution in the use of an ND filter and density accumulation curve are obtained to evaluate the color original.

9 Claims, 30 Drawing Figures

SLICE LEVEL 0.05

SLICE LEVEL 0.10

SLICE LEVEL 0.15

SLICE LEVEL 0.15

SLICE LEVEL 0.20 (M)

SLICE LEVEL 0.15 (C)

SLICE LEVEL 0.20 (Y)

FIG. 4
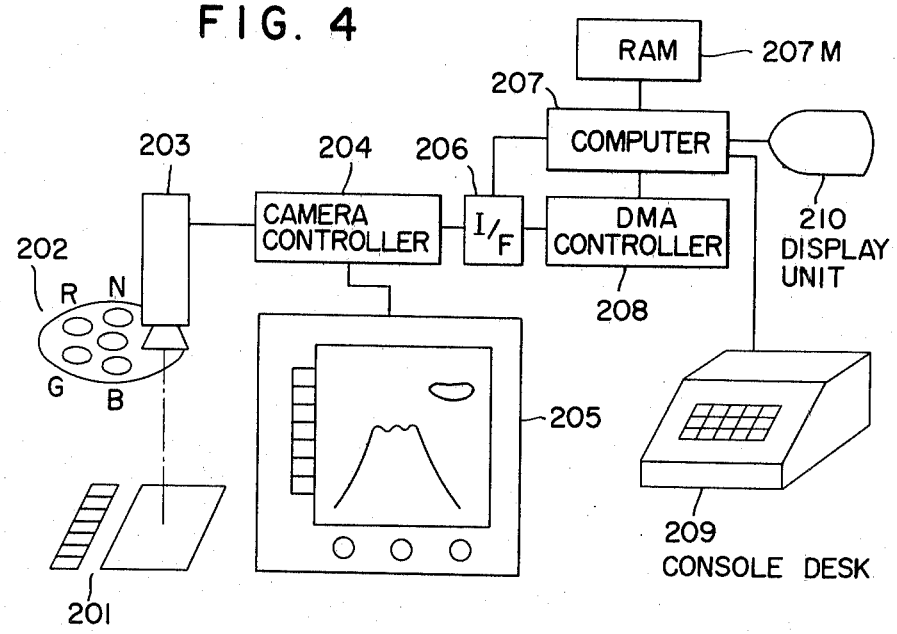
FIG. 5
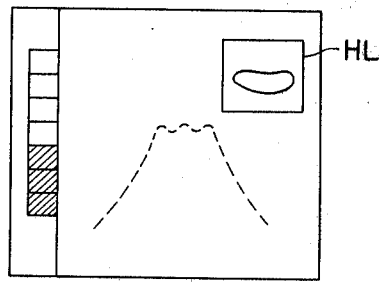
FIG. 6
|   | 0.05 | 0.10 | 0.15 | 0.20 | 0.25 | 0.30 | 0.35 | 0.40 | 0.45 | 0.50 | 0.55 | 0.60 | 0.65 |
|---|------|------|------|------|------|------|------|------|------|------|------|------|------|
| N |      |      |      |      |      | ▨    |      |      |      |      |      |      |      |
| C |      |      |      | ▨    |      |      |      |      |      |      |      |      |      |
| M |      |      |      |      |      | ▨    |      |      |      |      |      |      |      |
| Y |      |      |      |      |      |      |      |      | ▨    |      |      |      |      |

(A)

(B)

DENSITY LEVEL

COLOR ORIGINAL EVALUATING METHOD

BACKGROUND OF THE INVENTION

This invention relates to a method of evaluating a color original.

In the determination of color separation conditions for separating the colors of a printing color original, the location of a highlight reference point greatly affect the quality of original plates. Heretofore, in many cases, the color separating conditions are determined by the operator's subjective evaluation. Sometimes, the operation supplementarily uses a densitometer or employs a method of observing dots in a color original with the beam of a scanner. Thus, the results of evaluation of a color original differ depending on the abilities of the operations.

FIG. 1 is an explanatory diagram for a description of a conventional color separating method. In the method, separation curves are provided for the tones of cyan C, magenta M and yellow Y, respectively. One of the separation curves is designated by reference numeral 1 in FIG. 1. The separation curve 1 is formed with a point 11 defined by a color original density 0.3 and a separation density 95% employing as a highlight set point. However, if, in this connection, a separation curve is formed by erroneously employing a point 21 defined by a color original density 0.5 and a separation density 95% as a highlight set point, then the separation curve will be as indicated by reference numeral 2 in FIG. 1. Thus, the error of the curve 2 from the correct separation curve is (n-m) in terms of separation density, thus adversely affecting the reproduction of the color original.

SUMMARY OF THE INVENTION

Accordingly, an object of this invention is to eliminate the above-described difficulty accompanying a conventional color separating method.

The foregoing object and other objects of the invention has been achieved typically by the provision of a method of determining a highlight set point for a color original plate, in which the image of a printing color original is sliced by using an ND filter at a slice level which can be set as desired with a gray scale as a reference, to select a highlight region, the area of the highlight region is obtained so as to be employed as a highlight region area when the ND filter is used, and slice levels provided for cyan, magenta and yellow when highlight region areas with respect to these colors are determined as equal to the highlight region area in the use of the ND filter as possible, are employed as highlight set points for original plates for cyan, magenta and yellow, respectively.

The nature, principle and utility of the invention will become more apparent from the following detailed description when read in conjunction with the accompanying drawings.

Figure 1:
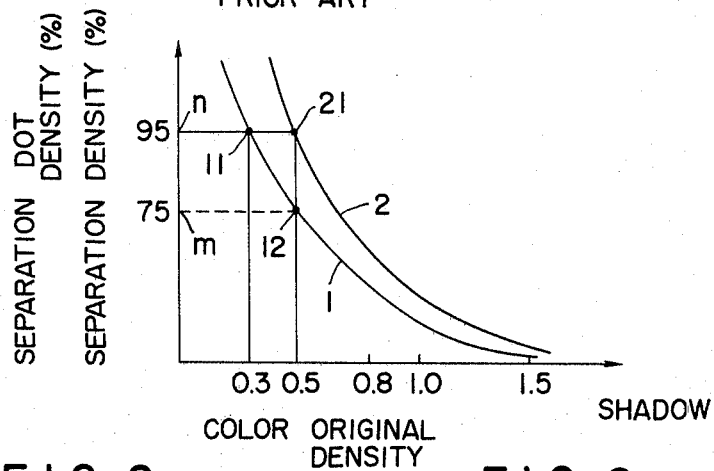
FIG. 1 is a diagram for a description of a conventional color separating method.
Figure 2:
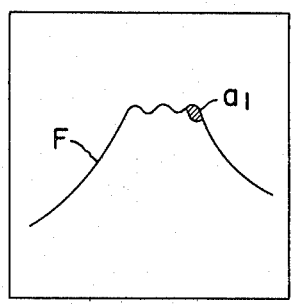
Figure 2:
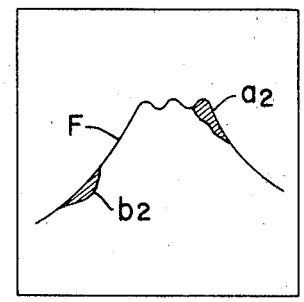
Figure 2:
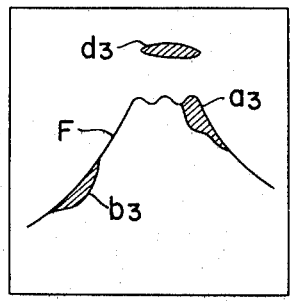
Figure 3:
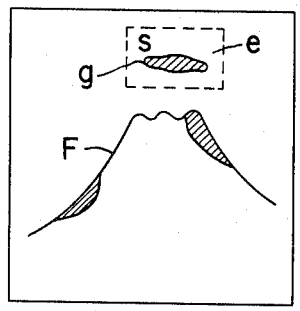
Figure 3:
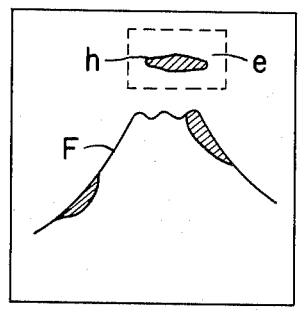
Figure 3:
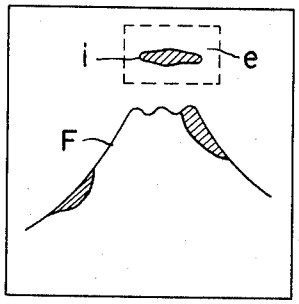
Figure 3:
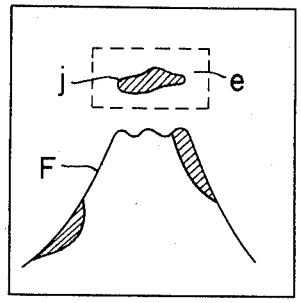
Figure 11:
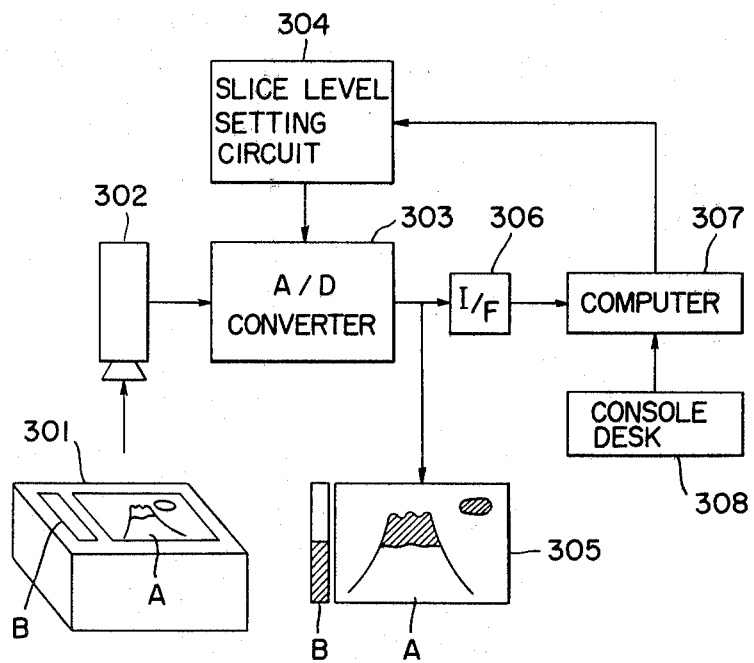
Figure 12:
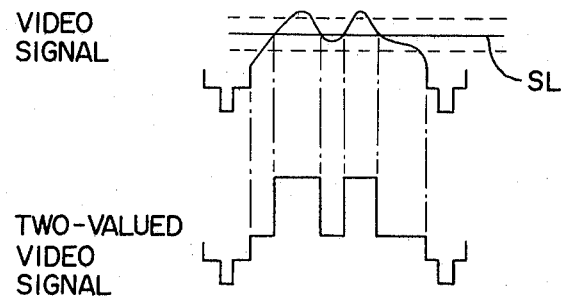
Figure 13:
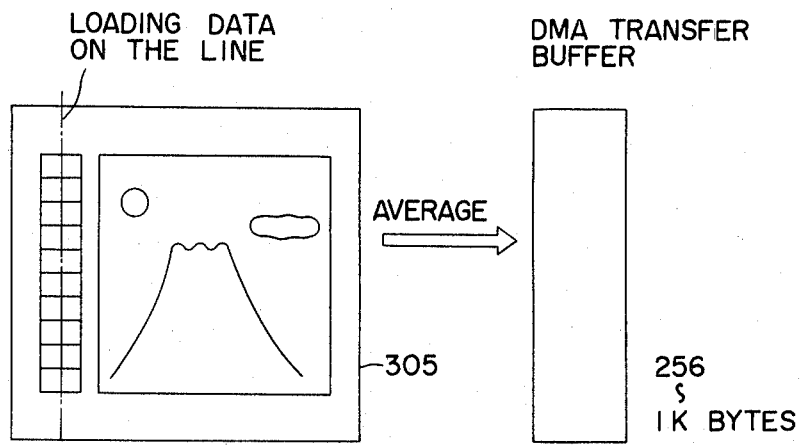
Figure 15:
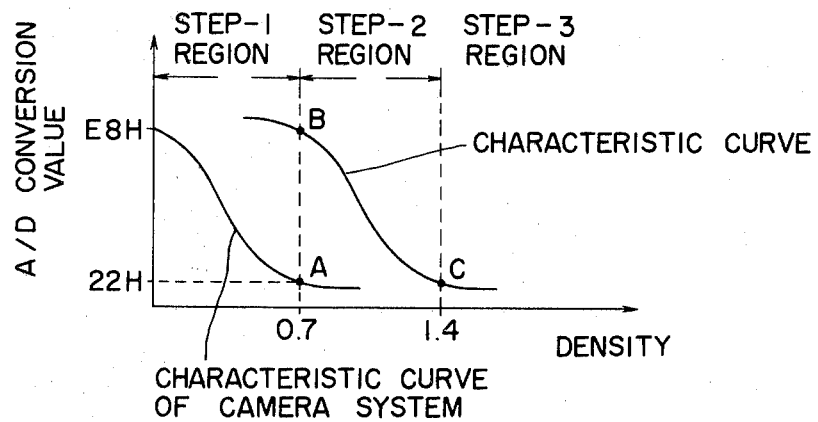
Figure 14:
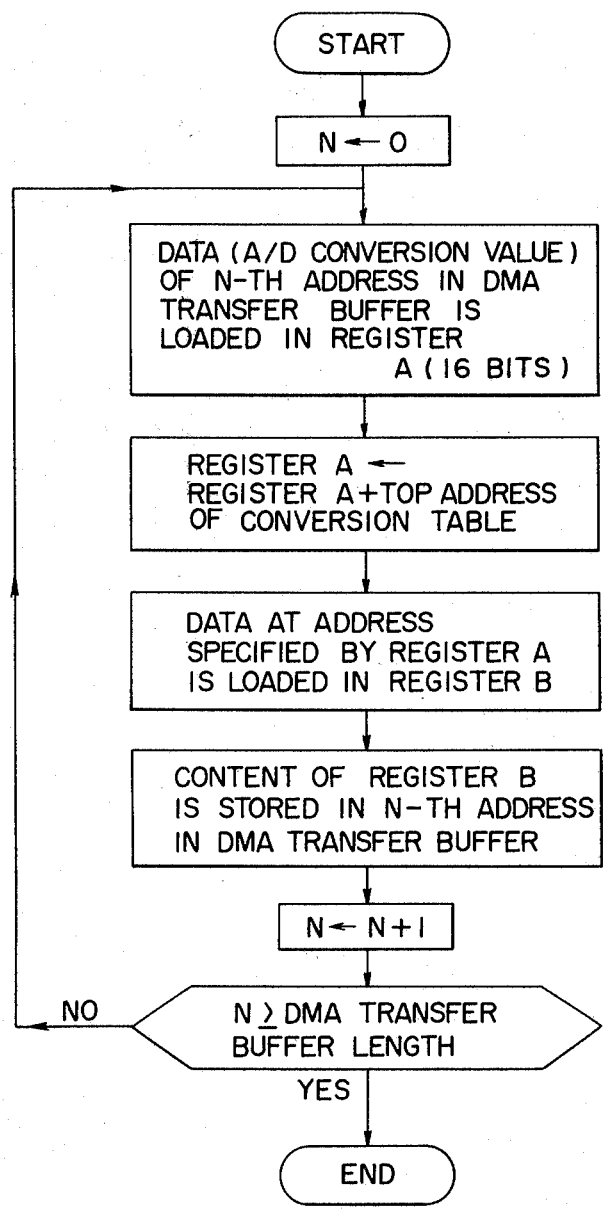
Figure 16:
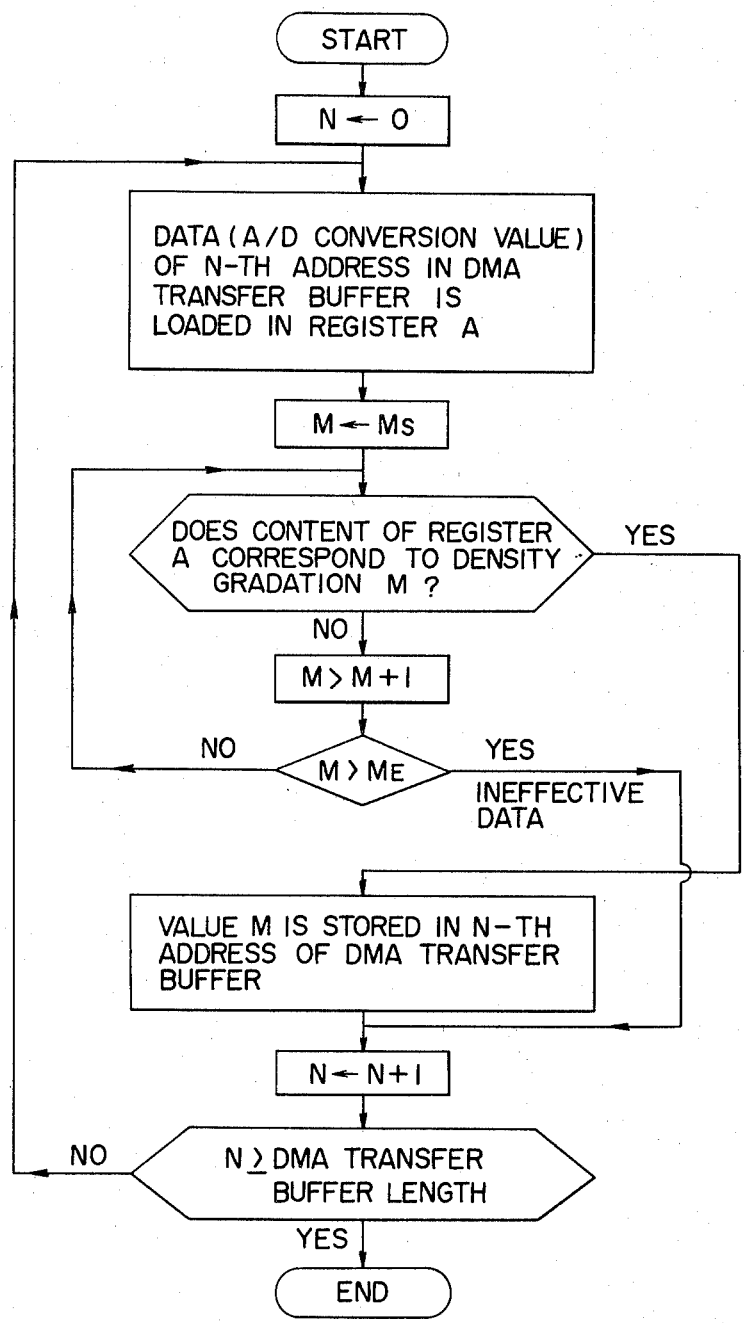
Figure 17:
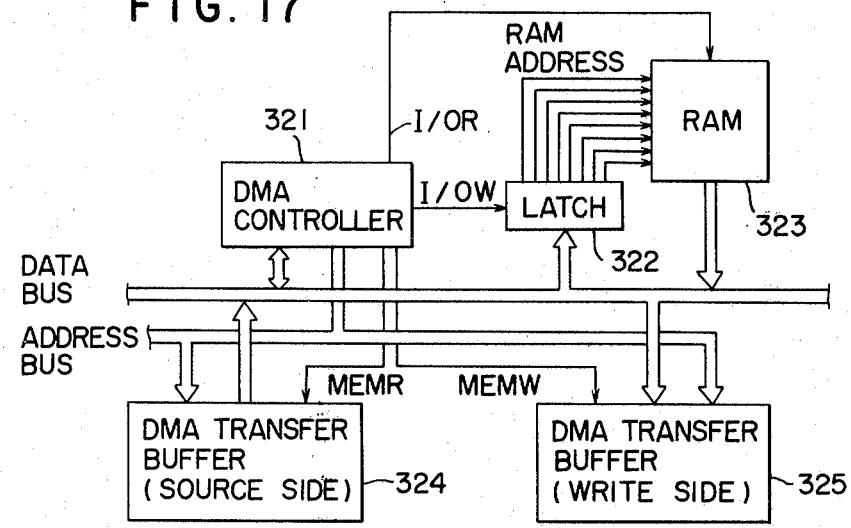
Figure 18:
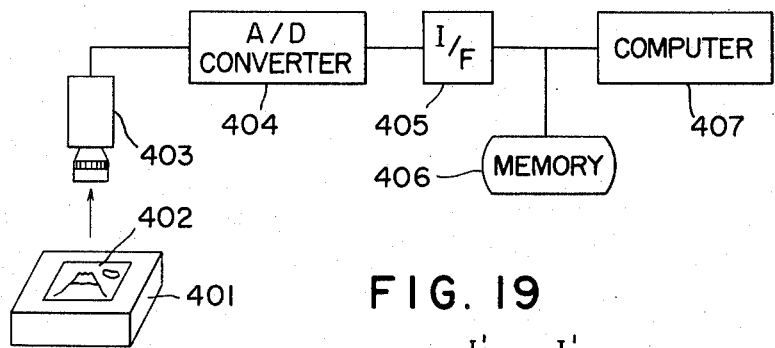
Figure 19:
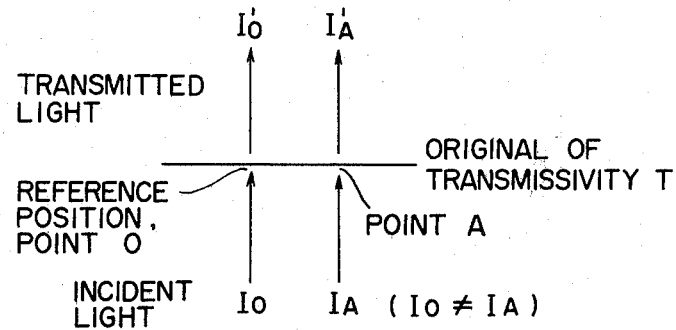
Figure 20:
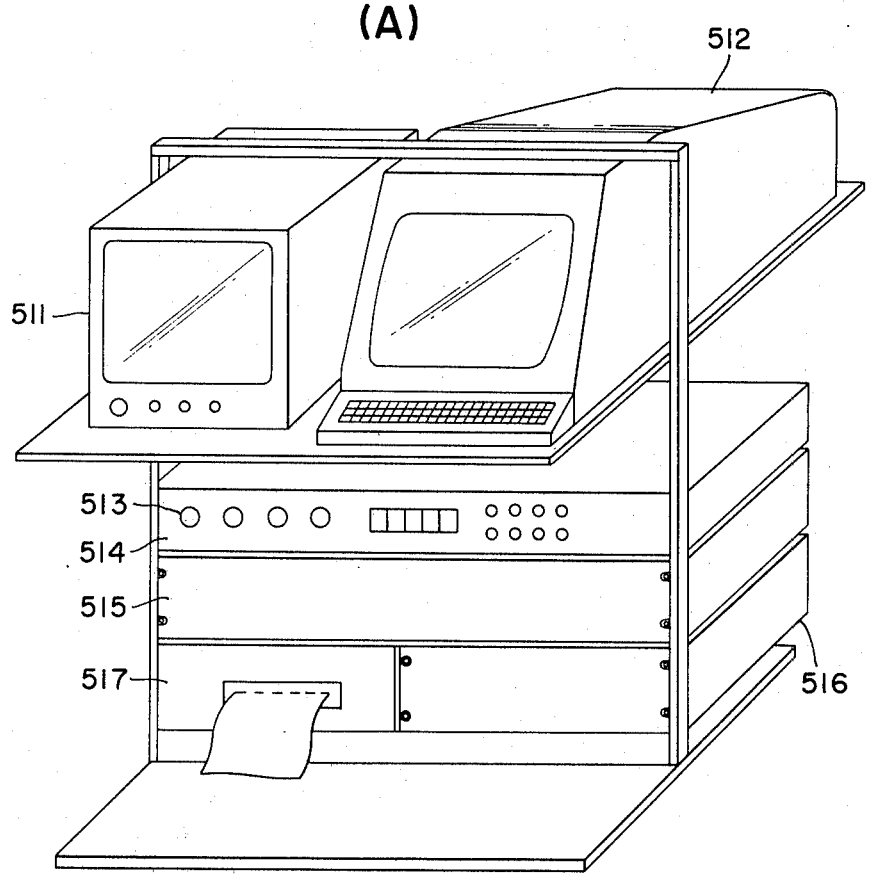
Figure 20:
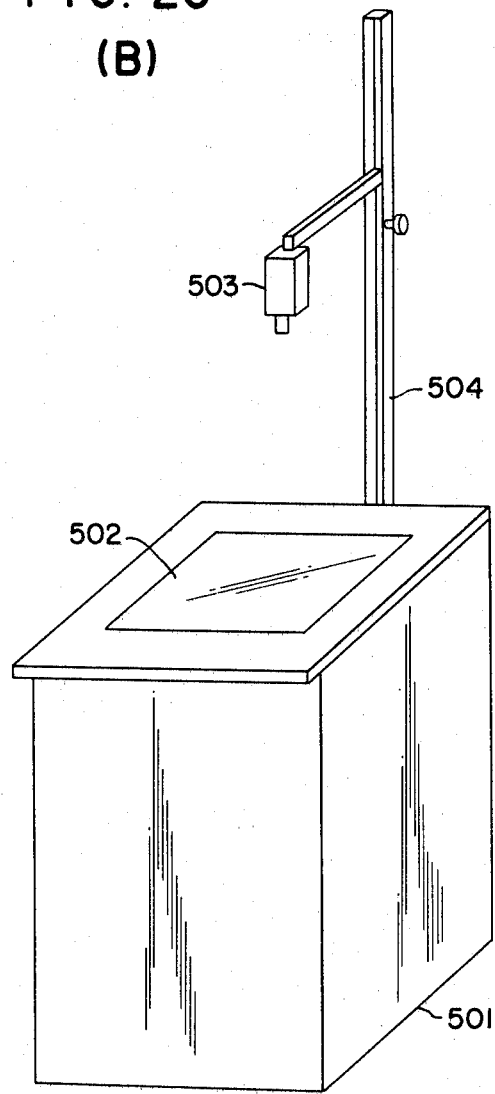
Figure 21:
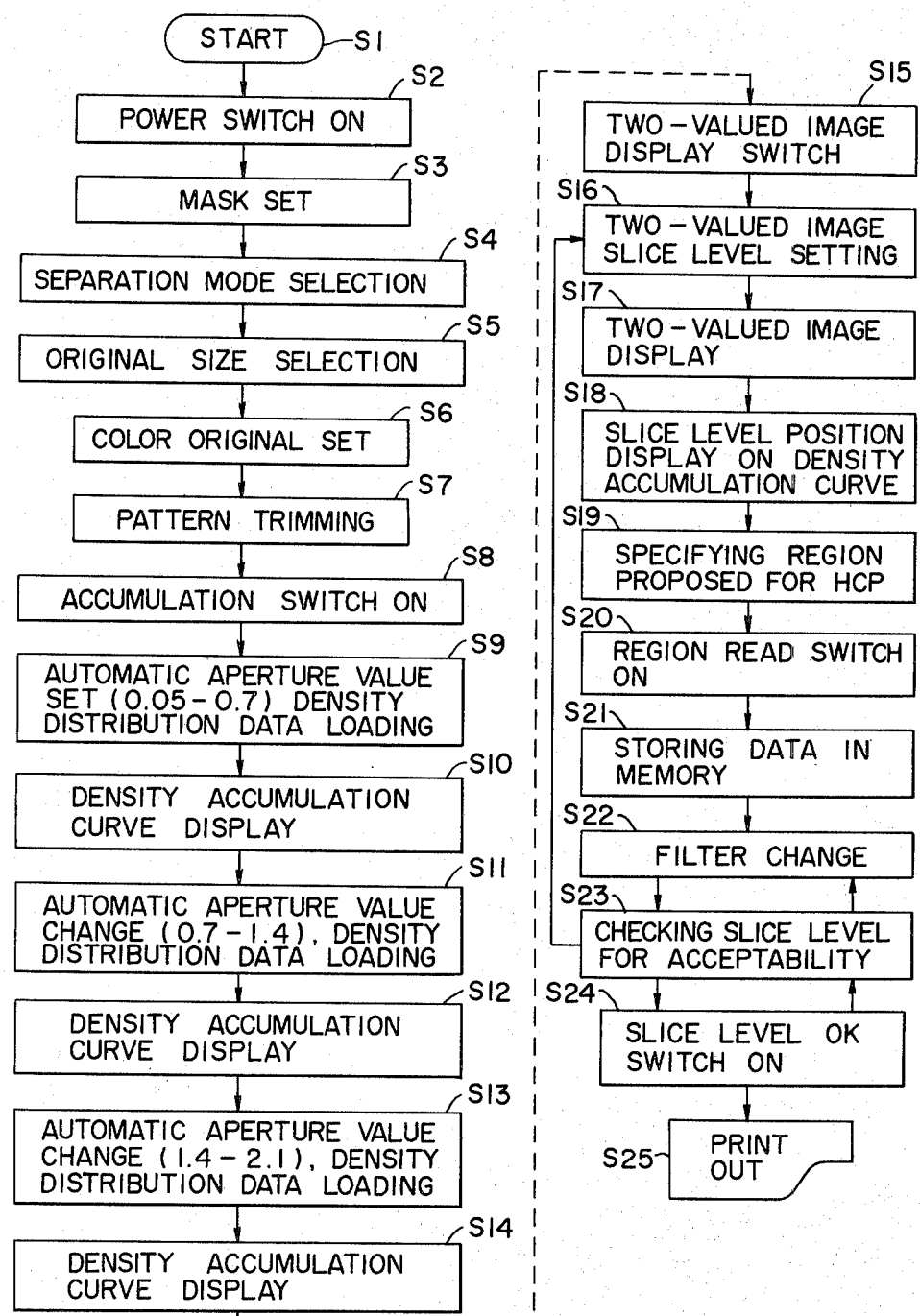
Figure 22:
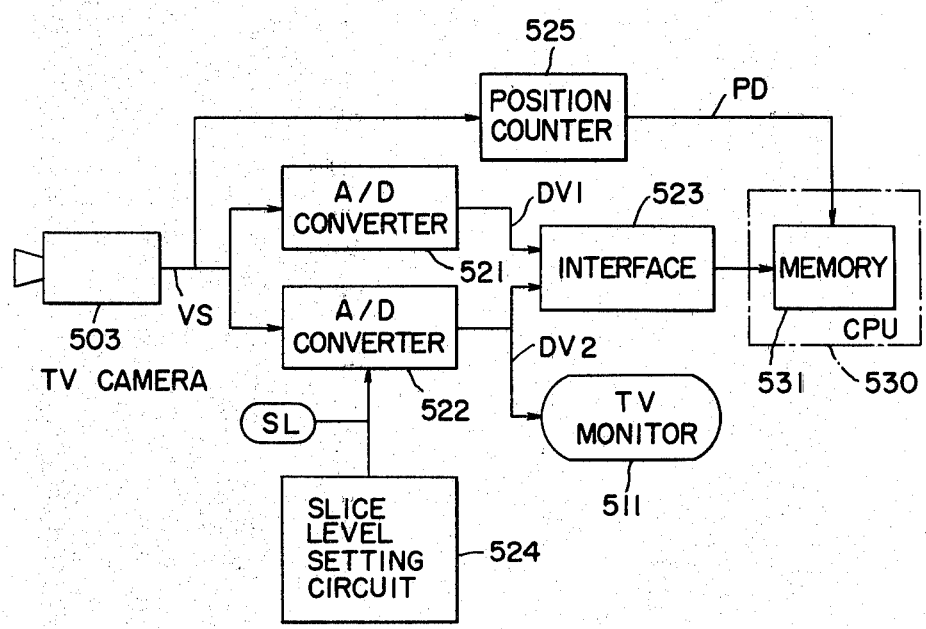
Figure 23:
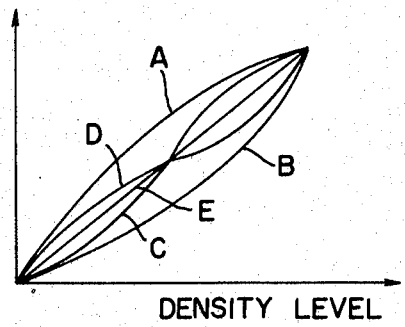

The parts (A) through (C) of FIG. 2 are diagrams for a description of a method of determining a highlight set point according to this invention;

The parts (A) through (D) of FIG. 3 are diagrams for a description of a trimming method according to the invention;

FIG. 4 is a block diagram showing one example of the arrangement of an original evaluating device used to determine a highlight set point in the invention;

FIG. 5 is a diagram for a description of the selection of a highlight region from a printing original;

FIG. 6 is a diagram showing slice level outputs for printing plates which are obtained according to the invention;

FIGS. 7 through 10 are diagrams for a description of a procedure for storing highlight region areas from a printing original;

FIG. 11 is a block diagram showing one example of the arrangement of a slice level calibrating device in the invention;

FIG. 12 is a diagram for a description of the conversion of a video signal into binary data with an A/D converter in the device in FIG. 11;

FIG. 13 is a diagram for a description of a method of providing luminance data on a gray scale, which forms one step in a method according to the invention;

FIG. 14 is a flow chart for a description of the conversion of the gray scale luminance data into density data;

FIG. 15 is a characteristic diagram for a description of a method of carrying out the provision of gray scale luminance data in a plurality of steps;

FIG. 16 is a flow chart for a description of a luminance to density conversion method without using a conversion table, which is compared with a luminance to density conversion method using a conversion table in the invention;

FIG. 17 is a block diagram showing one example of the arrangement of a conversion device for practicing the luminance to density conversion method of the invention;

FIG. 18 is a block diagram showing one example of the arrangement of a device for correcting surface non-uniformity;

FIG. 19 is a diagram for a description of a surface non-uniformity correcting principle;

FIGS. 20(A) and 20(B) show an external view of the original evaluating device according to the invention;

FIG. 21 is a flow chart for a description of the operation of the device of the invention;

FIG. 22 is a block diagram showing a circuit for obtaining a density accumulation curve;

FIG. 23 is a diagram showing examples of the density accumulation curve; and

Figure 24:
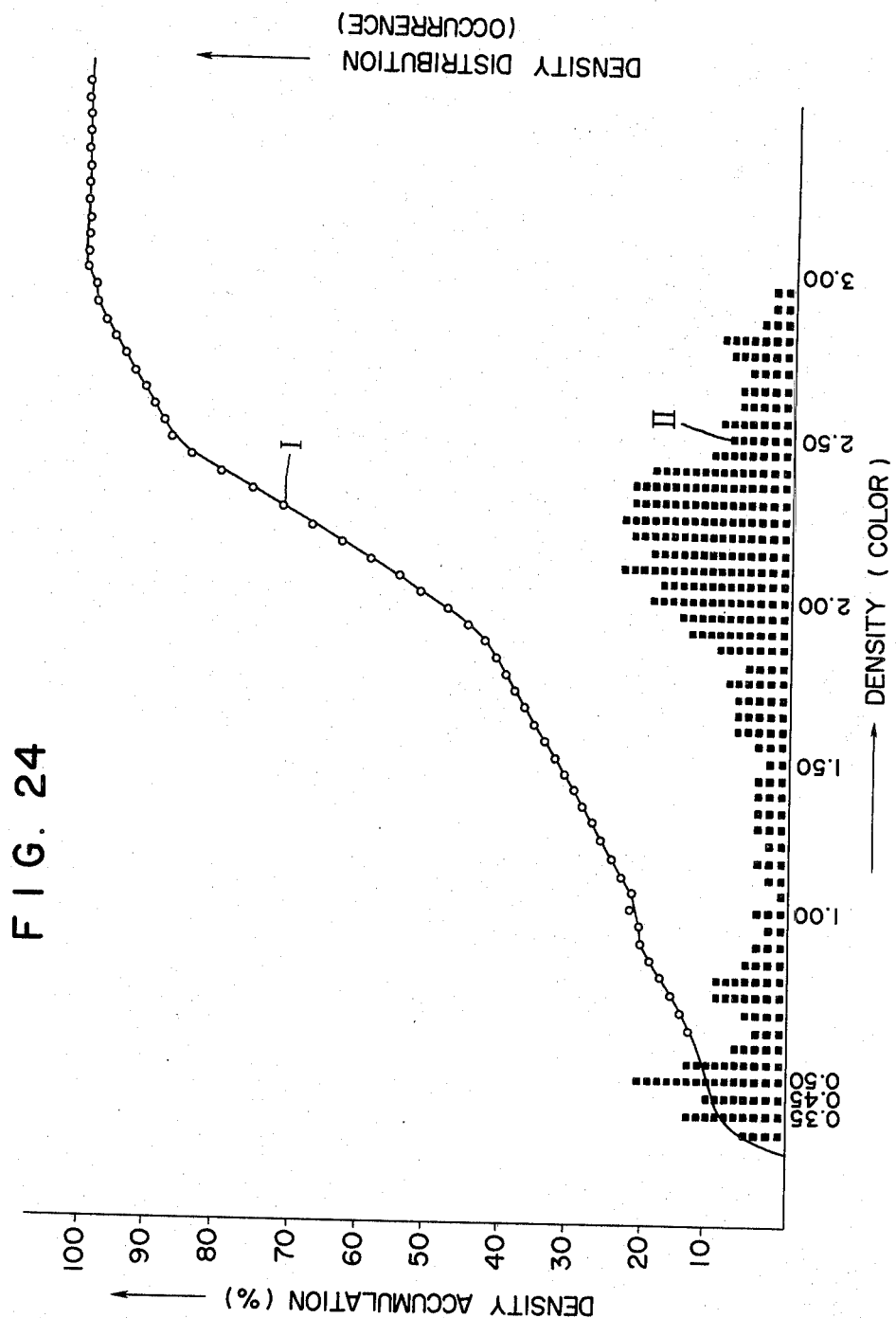

FIG. 24 is a diagram showing one example of a separation curve stored in a color scanner.

DETAILED DESCRIPTION OF THE INVENTION

First, a highlight set point determining method according to this invention will be described.

In the first step, a color original is photographed through an ND filter by a television camera, and the image of the original is formed on a monitor. The image is sliced according to variable density levels (hereinafter referred to as "slice levels", when applicable), to provide two-valued images as shown in the parts (A), (B) and (C) of FIG. 2.

The part (A) of FIG. 2 shows the white portion a1 of the image F which is sliced according to a density level 0.05. The part (B) of FIG. 2 shows the case where the image is sliced at a density level 0.10. In this case, the portion a1 is replaced by a portion a2, and another portion b2 is projected onto the monitor. The part (C) of FIG. 2 shows the case where the density level is changed to 0.15. In this case, another portion d3 is projected additionally.

If the density level 0.15 is considered as the highlight reference point of the image of the color original, the density level for slicing should be set around 0.15, for example 0.10 or 0.20. That is, various density distributions at various slice levels are detected on the screen of the monitor to determine an optimum level, which is employed as a highlight set point for a scanner. In this connection, the image is displayed as two-valued images (white and black), and in order to clearly show the positional relation of the portions of the whole image, the image F, etc. are displayed by low level signals.

The white portion of an image provides the same area for yellow Y, magenta M and cyan C when an ND filter is placed over it. By utilizing this fact, slice levels with color filters providing the same area are obtained. The parts (A) through (D) of FIG. 3 are provided to explain this.

As shown in the part (A) of FIG. 3, trimming is made by selecting a region e proposed for a highlight set point for the scanner from a two-valued image at a slice level 0.15 which is determined by using an ND filter (which is adapted to reduce the quantity of transmitted light irrespective of colors). The area s of the white portion of the proposed region e is calculated. The part (B) of FIG. 3 shows the two-valued image of magenta M which is obtained through a green filter, and a slice level at which the area of a two-valued image h in the proposed region e becomes s can be detected as 0.20. Similarly, in the part (C) of FIG. 3, a slice level 0.15 is detected from the two-valued image of cyan C which is obtained through a red filter. In the part (D) of FIG. 3, a slice level 0.20 is detected from the two-valued image of yellow Y which is obtained by using a blue filter. Thus, optimum highlight set points, with respect to separated colors, for the scanner are determined from the two-valued images of cyan C, yellow Y and magenta M, respectively.

One example of an original evaluating device according to the invention is as shown in FIG. 4.

In FIG. 4, reference numeral 201 designates an original consisting of a so-called "printing original" and a gray scale having a predetermined density band. The original 201 is placed on a light table (not shown) so that it is irradiated from below. As light passed through the original 201 is applied through a filter 202 to a television camera 203, the original 201 is photographed thereby.

The filter 202 consists of an ND filter adapted to reduce the amount of transmitted light irrespective of colors, a red filter R, a green filter G and a blue filter B. In the television camera, the lights passed through these filters are subjected to photo-electric conversion to provide outputs, which are applied to a camera controller 204. In the camera controller 204, video signals from the television camera 203 are converted into binary data. The binary data are applied to the television monitor 205, and it is further applied through an interface 206 to a computer 207. Data transmission is effected between the computer 207 and the camera controller 204 through the interface under the control of a DMA controller 208. A console desk 209 applies slice levels to the computer 207. The output of the computer 207 is supplied to a display unit 210.

Now, a method of determining highlight set points in the use of the red, green and blue filters for the original will be generally described with reference to FIGS. 4 through 6.

(1) First, the ND filter is set. The ND filter is so selected as to be able to provide gradation of densities of 0.0 to 0.7. In general, the density range of a color original is from about 0.0 to about 4.0, and the density range of the highlight region is from 0.0 to 0.7.

The slice levels at which the densities of the gray scale change towards "white" are stored in a memory 207M of the computer 207. Thus, the slice levels for determining a highlight region correspond to the densities of the gray scale. Accordingly, the two-valued image on the television monitor can be sliced every 0.05 density over the density range of from 0.0 to 0.7, by the operation of the console desk 209.

(2) The operator operates the console desk 209 to slice the two-valued image at the intervals of 0.05 density while observing it on the television monitor 205. In this operation, a region where the density level is changed from "black" to "white" is selected as the highlight region.

(3) The slice level in this case is determined as a fundamental slice level. The area of the highlight region is obtained from the binary data of the highlight region and is stored in the memory. In this operation, data on a portion including the highlight region HL are also loaded in (FIG. 5). A method of storing the area will be described later.

(4) Then, one of the red, green and blue filters is used to obtain a slice level at which its highlight region area comes closest to the highlight region area with the fundamental slice level. The slice level thus obtained is determined as the slice level of that color. The areas are automatically compared with each other by using the binary data. This comparison method will also be described later.

(5) The procedure described above in paragraph (4) is carried out for the remaining two color filters. Thus, slice levels are determined for all of colors yellow, magenta and cyan.

(6) The results thus obtained are displayed on the display unit 210. One example of the display is as shown in FIG. 6.

Thus, the slice levels at which the highlight regions for cyan, magenta and yellow in the use of the ND filter, and red, green and blue filters are the same can be obtained.

Method of Storing Highlight Region Area

Figure 7:
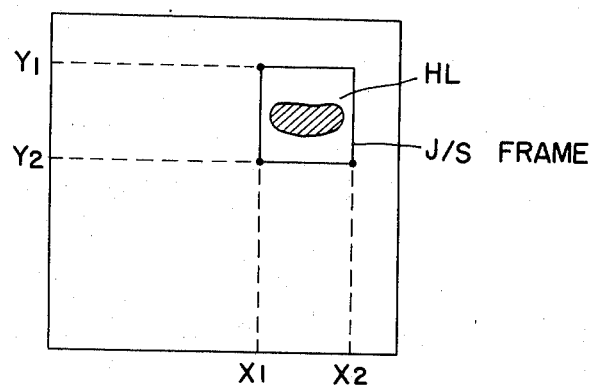

As shown in FIG. 7, the coordinates $(X_1, Y_1)$ and $(X_2, Y_2)$ of a joy stick frame surrounding an aimed highlight region are stored by operating a joy stick, and only the binary data in the joy stick frame are stored in the memory.

Figure 8:
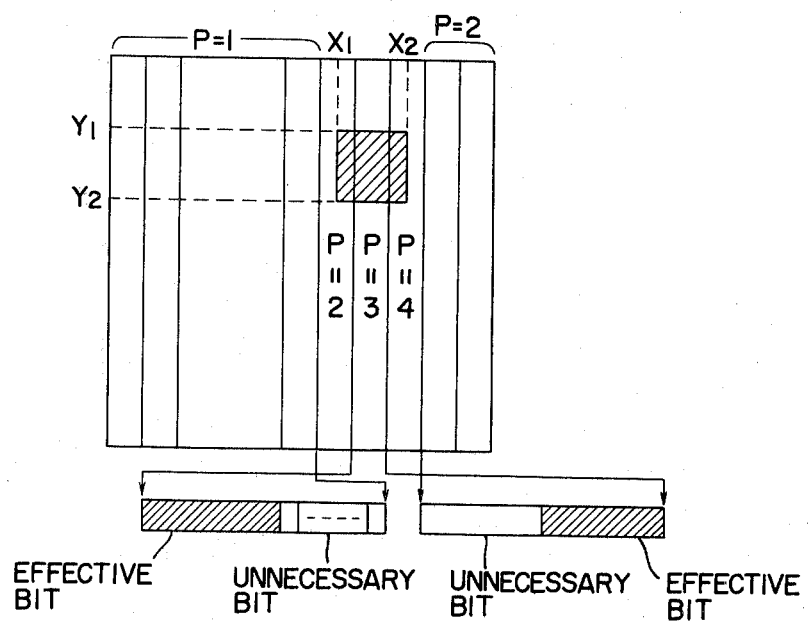

The first step in this procedure is as shown in FIG. 8. Regions not in common with the region defined by the joy stick are called ineffective regions $P=1$ and $P=5$. Regions, a part of the range, in the X-axis direction, of which are in common with the range $(X_1 \leq X \leq X_2)$, in the X-axis direction, of the joy stick frame are called regions $P=2$ and $P=4$. A region, all the range, in the X-axis direction, of which is within the range $(X_1 \leq X \leq X_2)$ is called a region $P=3$. Loading the data is carried out for the regions $P=2$, $P=3$ and $P=4$.

Figure 9:
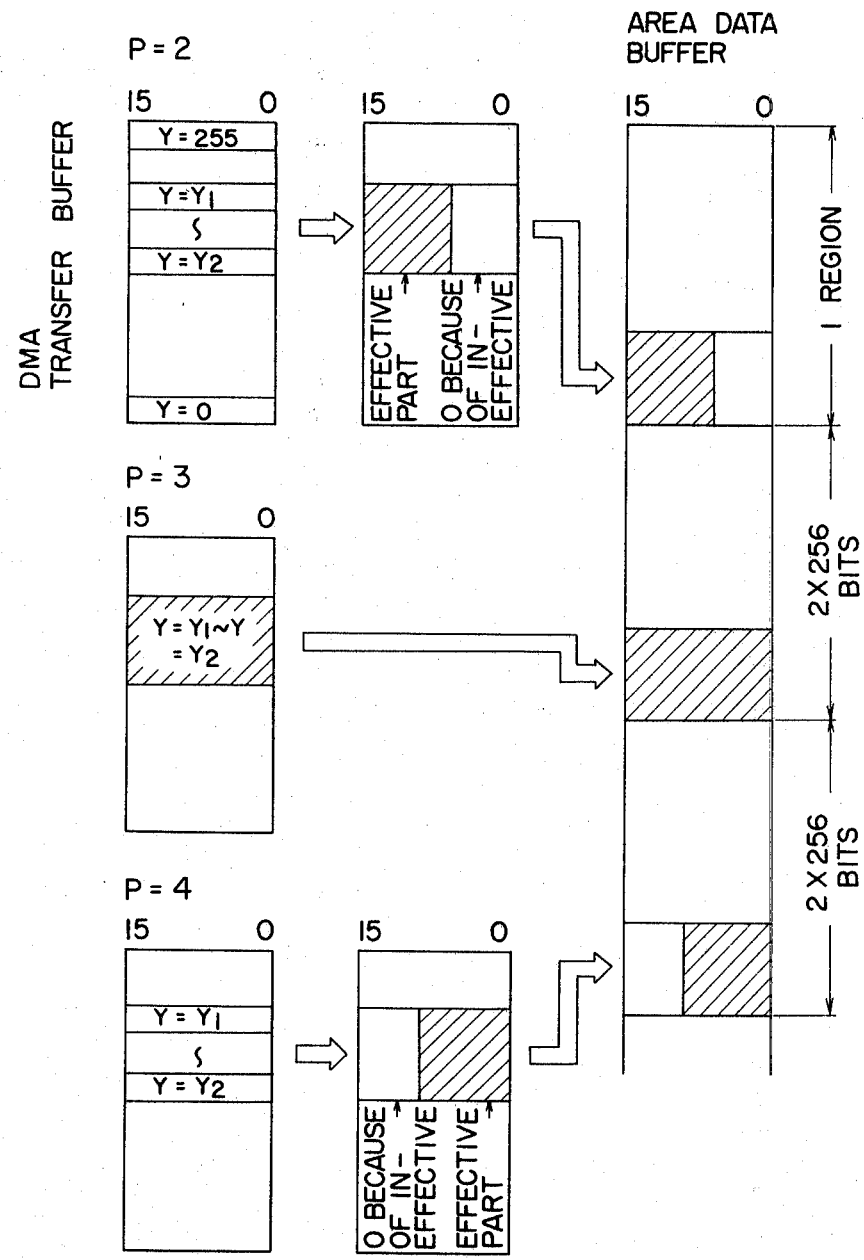

FIG. 9 is an explanatory diagram for a description of the data loading for the regions $P=2$, $P=3$ and $P=4$. After the data in the region $P=3$ are loaded in a DMA transfer buffer once, only the data corresponding to a portion defined by $Y_1$-$Y_2$ are stored in an area data buffer. The data in the regions P=2 and P=4 are inputted to the DMA transfer buffer once, and then only the data corresponding to a portion defined by $Y_1$-$Y_2$ are taken out, so that they are stored in the area data buffer in such a manner that the unnecessary leftmost bits of the region P=2 and the unnecessary rightmost bits of the region P=4 are $\phi$, respectively.

Figure 10:
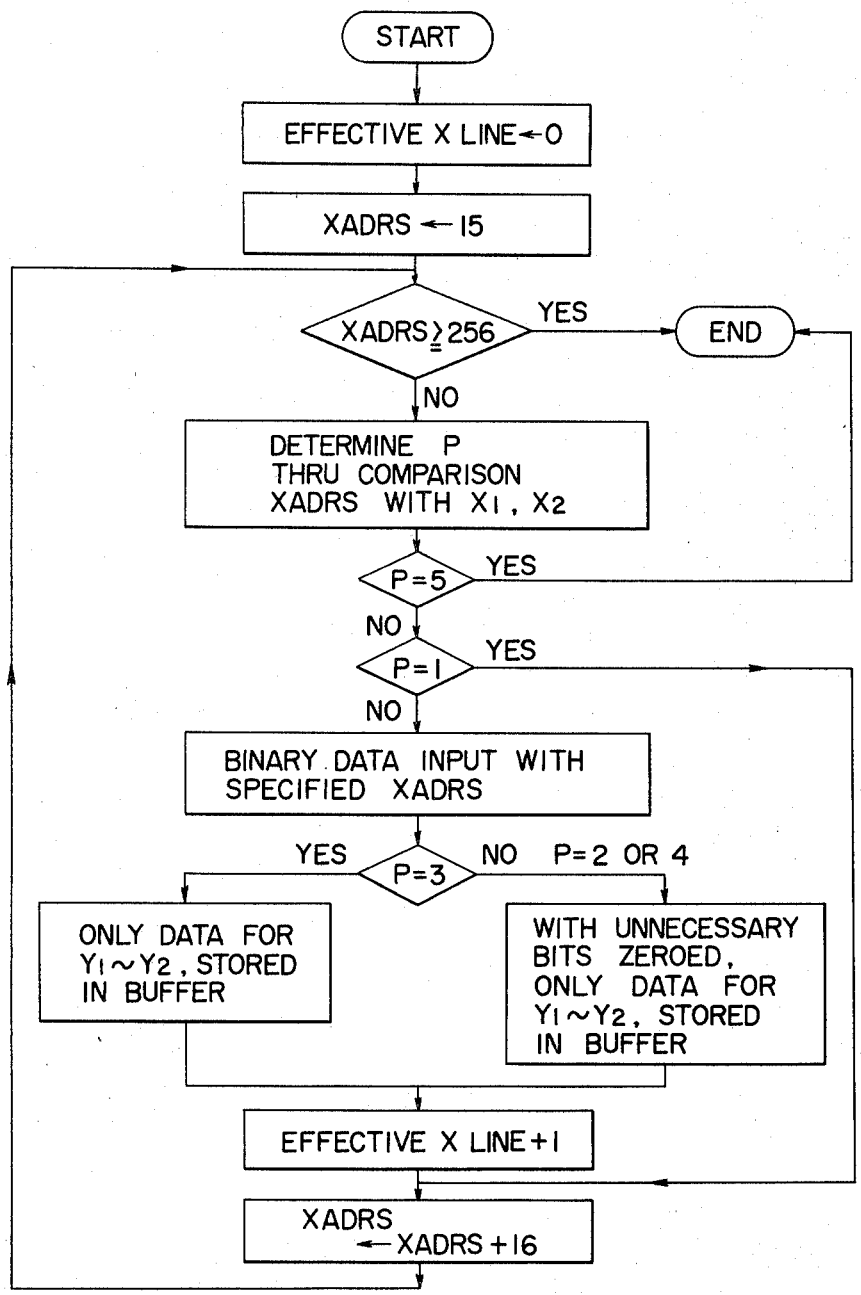

The above-described data storing operation is as shown in a flow chart of FIG. 10.

Area Comparison Method

For the area comparison, two area data buffers are used. Area data obtained in the use of the ND filter are stored in one of the area data buffers, and area data for cyan, magenta and yellow printing plates are stored in the other, so that the corresponding addresses of the effective data are subjected to comparison for every bit, whereby the relationship of the area obtained in the use of the ND filter to the areas for the cyan, magenta and yellow printing plates can be detected by counting the number of bits which are determined different through the comparison.

FIG. 11 shows one example of a slice level calibrating device according to the invention. In FIG. 11, reference numeral 301 designates a light table inside which is provided a light source for illuminating a color original A and a gray scale B placed on the light table 301. Light passed through the original A and the scale B is applied to a television camera 302 where it is converted into a video signal. The video signal is applied to an A/D (analog-to-digital signal) converter 303. The A/D converter 303 operates to convert an analog signal from the television camera 302 into binary data according to a slice level provided by a slice level setting circuit 302. The binary data is applied to a television monitor 305, and it is further applied through an interface 306 to a computer 307. As a result, the printing original A and the gray scale are displayed on the screen of the television monitor 305 in such a manner that their portions which are brighter than the slice level are white and their portion which are darker than the slice level are black.

On the other hand, the computer 307 is applied with a slice level setting signal by a console desk 308, so that a setting signal is applied to a slice level setting circuit 304, whereupon the latter 304 applies a slice level signal to the A/D converter 303.

With the device thus organized, a highlight portion of an image on the television monitor 305 can be changed in response to the operation of the console desk 308.

FIG. 12 shows the operation of the A/D converter in the device shown in FIG. 11. It is assumed that a video signal shown in the upper part of FIG. 12 is applied to the A/D converter 303 by the television camera 302, and a slice level SL is applied to the A/D converter 303 by the slice level setting circuit 304. In this case, the video signal expressed as binary data by referring to the slice level, namely, a two-valued video signal is as indicated in the lower part of FIG. 12.

The slice level SL corresponds to a reference density as described later, and it is selected out of several slice levels which have been set by the operation of the console desk 308. The computer 307 applies the setting signal to the slice level setting circuit 304 in response to an output signal from the console desk 308.

Now, a slice level calibrating operation will be described.

(1) First, the color original A and the gray scale B are placed on the light table 301. The gray scale B has seven density bands as shown in FIG. 5, and is used as a reference object.

(2) The computer 307 allows the slice level setting circuit 304 to set a slice level at the zero-th gradation, namely, the brightest slice level.

(3) The A/D conversion values (on luminance data) of the density bands of the gray scale, which are provided by the A/D converter 303 according to the slice level thus set, are loaded into the computer 307, where they are stored in the memory (not shown) of the computer 307. In this case, since the slice level is at the zero gradation it may be considered that all the A/D conversion values of the density bands of the gray scale are at a low logic level (hereinafter referred to merely as "L", when applicable); however, some may be at a high logic level (hereinafter referred to merely as "H", when applicable).

(4) If a density band whose loaded A/D conversion value is changed from "L" to "H" for the first time is detected, then the slice level gradation at that time is determined as the slice level of that band and is stored in the memory of the computer 307. Thus, one of the 256 gradations is determined at which the slice level corresponding to the brightest of the seven density bands of the gray scale is.

(5) The computer carries out the operations described in the above paragraphs (3) and (4) by regarding the slice level provided by the slice level setting circuit 304 as a slice level which is darker by one gradation, until slice levels are determined for all of the density bands of the gray scale.

(6) When the slice levels of all the density bands have been determined, the console desk 308 applies to the computer 307 a signal for selecting a slice level which corresponds to one of the seven density bands of the gray scale, thereby to set a slice level for the slice level setting circuit 304. As a result, the two-valued image of the color original is formed on the television monitor 305. As the slice level is changed by operating the console desk 308, the corresponding two-valued image is formed on the television monitor 305. Thus, a slice level suitable for the printing original can be selected.

A luminance data to density data conversion operation in the invention will be described with reference to FIGS. 13 through 16.

It is assumed that a printing original and a gray scale are placed on the light table as shown in FIG. 13. Under this condition, the luminance data of the density scale are obtained by the use of filters for measuring densities 0.0 to 0.7, thereby to obtain the correspondence of the density bands of the density scale to the luminance data. The accuracy of the data can be improved by employing a method in which each data is obtained plural times and the average value thereof is stored, as a luminance data, in a DMA transfer buffer.

A conversion table is formed from the correspondence of the densities of the bands of the gray scale to the luminance data (A/D conversion values). For instance in the case where the A/D conversion values correspond to the densities (taken at the density intervals of 0.05) as indicated in the two leftmost columns in the following Table 1, address assignment is carried out for the memory so that a conversion table is formed as indicated in the following Table 2:

TABLE 1

| Density | A/D value (hexadecimal) | Density band | | A/D conversion value (hexadecimal) |
|---|---|---|---|---|
| 0.0 | E8$_H$ | | | |
| 0.05 | DC$_H$ | 1 | −0.05 | FF - DC |
| 0.10 | D1$_H$ | 2 | 0.05–0.10 | - D1 |
| 0.15 | C3$_H$ | 3 | 0.10–0.15 | - C3 |
| 0.20 | B5$_H$ | 4 | 0.15–0.20 | - B5 |
| 0.25 | A6$_H$ | 5 | 0.20–0.25 | - A6 |
| 0.30 | 97$_H$ | 6 | 0.25–0.30 | - 97 |
| 0.35 | 88$_H$ | 7 | 0.30–0.35 | - 88 |
| 0.40 | 76$_H$ | 8 | 0.35–0.40 | - 76 |
| 0.45 | 64$_H$ | 9 | 0.40–0.45 | - 64 |
| 0.50 | 55$_H$ | 10 | 0.45–0.50 | - 55 |
| 0.55 | 47$_H$ | 11 | 0.50–0.55 | - 47 |
| 0.60 | 3A$_H$ | 12 | 0.55–0.60 | - 3A |
| 0.65 | 2C$_H$ | 13 | 0.60–0.65 | - 2C |
| 0.70 | 22$_H$ | 14 | 0.65–0.70 | - 22 |

Note: As A/D value 21 or less means that the density is larger than 0.7, it is regarded as ineffective data in step 1.

TABLE 2

| Top address | | 0 | 1 | 2 | 3 | 4 | 5 | 6 | 7 | 8 | 9 | A | B | C | D | E | F |
|---|---|---|---|---|---|---|---|---|---|---|---|---|---|---|---|---|---|
| | 00 | 0 | — | — | — | — | — | — | — | — | — | — | — | — | — | — | 0 |
| | 10 | 0 | — | — | — | — | — | — | — | — | — | — | — | — | — | — | 0 |
| | 20 | 0 | 0 | 0E | — | — | — | — | — | — | — | — | 0E | 0D | — | — | 0D |
| | 30 | 0D | — | — | — | — | — | — | — | — | — | — | 0D | 0C | — | — | 0C |
| | 40 | 0C | — | — | — | — | — | — | 0C | 0B | — | — | — | — | — | — | 0B |
| | 50 | 0B | — | — | — | 0B | 0A | — | — | — | — | — | — | — | — | — | 0A |
| | 60 | 0A | — | — | 0A | 09 | — | — | — | — | — | — | — | — | — | — | 09 |
| | 70 | 09 | — | — | — | — | — | 09 | 08 | — | — | — | — | — | — | — | 08 |
| | 80 | 08 | — | — | — | — | — | — | — | 08 | 07 | — | — | — | — | — | 07 |
| | 90 | 07 | — | — | — | — | — | 07 | 06 | — | — | — | — | — | — | — | 06 |
| | A0 | 06 | — | — | — | — | 06 | 05 | — | — | — | — | — | — | — | — | 05 |
| | B0 | 05 | — | — | — | 05 | 04 | — | — | — | — | — | — | — | — | — | 04 |
| | C0 | 04 | — | 04 | 03 | — | — | — | — | — | — | — | — | — | — | — | 03 |
| | D0 | 03 | 02 | — | — | — | — | — | — | — | — | — | 02 | 01 | — | — | 01 |
| | E0 | 01 | — | — | — | — | — | — | — | — | — | — | — | — | — | — | 01 |
| | F0 | 01 | — | — | — | — | — | — | — | — | — | — | — | — | — | — | 01 |

Note:
A region including 0 means that A/D conversion value is ineffective.

Table 2 is for densities of 0.0 to 0.7, and it is formed as a conversion table for 256 bytes (=16×16 bytes). In Table 2, an A/D conversion value is an address from the top address, and a density gradation corresponding to the A/D conversion value is equal to the contents of the address.

FIG. 14 is a flow chart indicating an operation for carrying out the conversion as indicated in Tables 1 and 2. Original's data which are loaded into the DMA transfer buffer in the measurement are converted into the corresponding density gradations according to the program shown in FIG. 14.

FIG. 15 shows the relation between the measurement characteristic of a range of densities of 0.0 to 0.7 and the measurement characteristic of a range of densities of 0.7 to 1.4. The range of densities 0.0 to 0.7 and the range of densities 0.7 to 1.4 will be referred to as "a step-1 region" and "a step-2 region", respectively. As the density of a filter for measuring the step-2 region is smaller by 0.7 than that of a filter for measuring the step-1 region, the characteristic curve of a camera system is shifted as much as a density 0.7 in parallel towards the right as viewed in FIG. 15. Accordingly, when the same A/D conversion value as that obtained in the measurement with the filter for the step-1 region is obtained, its corresponding density is larger by 0.7.

Accordingly, in the measurement using the filter for the step-2 region, what is obtained by shifting as much as fourteen gradations (among the 256 gradations) the data in the conversion table for the step-1 region is employed. The left-hand side of the point B on the characteristic curve 2 is a region to be measured as the step-1 region, and the right-hand side of the point C on the characteristic curve 2 is a region to be measured as the step-3 region. Therefore, the data of the addresses of the conversion table corresponding to these regions are treated as ineffective data $\phi$.

Similarly, the data for the step-3 region are processed.

FIG. 16 is a flow chart in the case where density conversion is carried out without forming a conversion table, in order to describe that the luminance to density conversion using the conversion table in Table 2 is advantageous. The period of time required for executing the program in FIG. 16 is much longer than that required for executing the program with the above-described conversion table formed. Thus, the formation of the conversion table results in high efficiency. Furthermore, the employment of the conversion table is considerably convenient in performing the luminance to density conversion with hardware.

FIG. 17 shows one example of the arrangement of the hardware which comprises: a DMA controller 321, a latch circuit 322; a 256-byte RAM 323; a DMA transfer buffer 324 (on the source side); and a DMA transfer buffer 325 (on the write side).

The data of the conversion table are written into the RAM 323 in advance. In the luminance to density conversion, under the control of the DMA controller 321 the data (A/D conversion values) of the DMA transfer buffer 324 are converted into the corresponding density gradation values, which are written into the DMA transfer buffer 325. The address bus and the control line are controlled by the DMA controller 321. Thus, the read out, the conversion and the data write are carried out at high speed continuously a predetermined number of times.

In the DMA read-out cycle, the DMA controller 321 outputs an MEMR signal, and data at specified addresses in the DMA transfer buffer (on the source side) 324 are supplied to the data bus. In succession with this, the DMA controller 321 outputs an I/O W signal, and the data on the data bus are latched by the 8-bit latch circuit 322.

The latch circuit 322 is connected to the address lines of the RAM, as it is. Therefore, when in the DMA write cycle the DMA controller 321 outputs an I/O R signal, data at the address in the RAM 323, which is specified by the content (or A/D conversion value) of the latch 322, is supplied to the data bus, and the data thus supplied is stored at the specified address of the DMA transfer buffer 325 when the MEMW signal is outputted.

The method of carrying out the luminance to density conversion with the conversion table formed as described above is considerably effective in that it can be readily practiced with hardware.

FIG. 18 shows one example of the arrangement of a device for correcting surface non-uniformity. In FIG. 18, reference numeral 401 designates a light table on which a color original 402 is placed. The color original 402 is irradiated by a light source built in the light table 401. Light passed through the original 402 is applied to a television camera 403, where it is converted into luminance data. The luminance data is converted into a digital signal by an A/D converter 403. The digital signal is applied through an interface 405 to a memory unit 406, where it is stored. The luminance data in the case where a printing original is placed on the light table, and the luminance data in the case where no printing original is placed thereon are stored in the memory unit 406. A computer 407 processes these luminance data to provide a corrected luminance data.

FIG. 19 is a diagram for a description of the principle of the invention, showing light beams in an optical system from the light table 401 to the lens of the television camera 403 (FIG. 18).

It is assumed that light beams $I_O$ and $I_A$ non-uniform depending on positions are incident to an original having a transmissivity T. In practice, there are surface non-uniformity elements such as the lens and the image pickup tube in the course of light passed through the original; however, the light beams will be handled as they are before the original, because this will cause no bad influence to the description and can simplify the description.

Furthermore, it is assumed that an incident light quantity and a transmitted light quantity are represented by $I_O$ and $I_O''$, respectively, at a reference position O, and an incident light quantity and a transmitted light quantity are represented by $I_A$ and $I_A'$, respectively, at a position A different from the reference position O.

That is, $$I_O' = T I_O \qquad (1)$$

$$I_A' = T I_A \qquad (2)$$

Therefore, $$I_O' = I_O I_A'/I_A \qquad (3)$$

Thus, it can be corrected to the transmitted light quantity at the reference position by calculating the equation (3) with the computer after the light quantities $I_O$ and $I_A$ are measured with the original 402 not placed on the light table, i.e. with the transmissivity T=1 and the light quantity $I_A'$ is measured with the original 402 placed on the light table 401.

FIGS. 20(A) and 20(B) show an external view of the original evaluating device according to the invention.

A television camera 503 is mounted on a post 504 in such a manner that it is movable up and down above a light table 502 on an original stand 501, as shown in FIG. 20(B). A unit for processing the output video signal of the television camera 503, as shown in FIG. 4(A), comprises: a television monitor 511 for projecting onto its screen the image at a preset slice level which is picked up by the television camera 503; a graphic display for displaying necessary data and graphs; a controller 514 having operating switches 513 on the front panel and a control circuit incorporated; an interface 515; a power unit 516; and a printer 517 for printing out necessary data.

The television camera 503 has input resolutions 256×256 (picture elements/frame), 512×512 (picture elements/frame) and 1024×1024 (picture elements/frame) which can be selected freely. The television camera has a density range of from 0.06 to 0.94. The television monitor 511 has a 12-inch monochromatic cathode ray tube (525 scanning lines/frame) which displays an input natural image, and a two-valued image for monitoring at the video slicer setting time.

The operation of the original evaluating device will be described with reference to a flow chart in FIG. 21.

First, the power switch is turned on (Steps S1 and S2), and a mask (or a window) is set on the light table 502 (Step S3). A resolution mode is selected from the television camera 503 by operating the operating switches 513 on the controller 514 (Step S4). Then, an original size (5×7, 4×5, 6×6 or 35 mm) is specified by the operating switches 513 (Step S5), and a magnification and an aperture value are selected for the television camera and a light quantity calibration is carried out for the television camera.

Under this condition, a color original is placed on the light table 502 (Step S6). The image of the color original is projected, as a natural image, onto the television monitor 511. While observing this image, the operator operates the joy stick to move and specify a trimming position and operates the X dial and the Y dial to specify a trimming region with the X-axis and the Y-axis (Step S7). Upon specifying of the trimming region, an accumulation switch (among the operating switches 513) is turned on (Step S8), and the density distribution of the pattern in the trimming region and a density accumulation curve are displayed on the graphic display 512. More specifically, the aperture value of the television camera is adjusted so that the density distribution in a wide density range and the density accumulation curve are obtained stepwise (with density ranges 0.05 to 0.7, 0.7 to 1.4, 1.4 to 2.1, and so forth, for instance). How to obtain the density distribution and the density accumulation curve will be described in more detail.

A two-valued image display switch (among the operating switches 513) is depressed (Step S15) to set a slice level for a two-valued image (Step S16), whereupon a two-valued image at the slice level thus set is displayed on the television monitor 511 (Step S17) and the slice level set position is displayed on the density accumulation curve on the graphic display 512 (Step 18).

A region proposed for a highlight set point is specified with the joy stick and the X-axis switch and the Y-axis switch (Step S19), and a region read switch is turned on to store data in the memory (Steps S20 and S21). In this connection, the slice level is checked for acceptability (Step S23). If the slice level is not acceptable, another slice level is set and the same operation is repeated. If the slice level is acceptable, the red, blue and green filters are automatically replaced (Step S22) to perform the same trimming operation for each of cyan C, yellow Y and magenta M, so that the area and position of a white portion of the two-valued image at the highlight set point specified with respect to each filter are read and stored in the memory.

Thus, the highlight set points are determined for yellow Y, magenta M and cyan C from the relationships between the area of the white portion determined with the ND filter placed on the original and the areas of the white portions determined with the red, blue and green filters. Then, a slice level OK switch is turned on (Step S24), so that the printer 517 prints out the density accumulation curve, the density distribution and the highlight set points with respect to yellow Y, magenta M and cyan C (Step S25).

Now, the density distribution and density accumulation curve obtaining method mentioned above will be described in more detail.

The output video signal VS of a television camera 503 is applied to A/D converters 521 and 522, as shown in FIG. 22, where it is converted into digital signals DV1 and DV2, respectively. The A/D converter 521 operates to digitalize the video signal in 256 different density levels. The 8-bit digital signals DV1 thus obtained are successively stored in a memory 531 of a central processing unit (CPU) 530 through an interface 523. The other A/D converter 522 operates to convert the video signal VS into a binary signal, i.e. the digital signal DV2 according to the output slice value SL of a slice level setting circuit 524. The digital signal DV2 is applied through the interface 523 to the memory 531, where it is stored. The digital signal DV2 is applied to a television monitor so that a two-valued image is projected on its screen.

The video signal VS of the television camera 503, on the other hand, is inputted to a position counter 525, the output position data PD of which is applied to the memory 531. In this operation, the digital signals DV1 and DV2 from the interface 523 are successively stored at the addresses which are specified by the position data PD.

The data stored in the memory 531 is inputted to the arithmetic unit 530 to convert the data with 256 density levels to a predetermined number of density ranges for calculating the percentage of the occurrence (density distribution) in each of the density ranges. The percentage of the occurrence is outputted to the graphic display 512 as signals for displaying in the order of magnitude of density level. The percentages thus obtained are displayed, as a density accumulation curve, on the graphic display 512, as shown in FIG. 24. That is, a density accumulation curve indicated as characteristic I and a density distribution indicated as characteristic II are provided.

According to the characteristic trend (such as a proportional characteristic or a characteristic steep in the low density level range) of the density accumulation curve, the operator selects and specifies a separation curve (tone setting) for the color scanner. FIG. 23 shows examples of the separation curves. Out of a plurality of separation curves A through E stored in the color scanner, one which is most closest to the obtained density accumulation curve is selected.

What is claimed is:

1. A color original evaluating method, in which an image on a TV monitor which is obtained by photographing a printing original through an ND filter is converted into a two-valued image by density-slicing at a desired slice level with a grey scale as a reference;
   a highlight region is determined from the position and area of a white portion of said two-valued image, the area of said region being employed as a highlight region area in the use of said ND filter;
   slice levels of images in cyan, magenta and yellow are obtained from said color original with red, green and blue filters in such a manner that the areas obtained with each of said filters become as equal to said highlight region area as possible, said slice levels of image in cyan, magenta and yellow being employed as highlight set points of said colors.

2. A method as claimed in claim 1, in which
   the luminance data of a gray scale having predetermined density bands are obtained,
   a plurality of slice levels corresponding to the density bands of said gray scale are obtained according to said luminance data thus obtained, and
   a printing original is evaluated according to said slice levels thus obtained.

3. A method as claimed in claim 2, in which
   a television camera is provided to pickup the image of a color original, and
   said television camera is provided with means for controlling light incident to said television camera from said color original, so that said television camera picks up the image of said color original in a plurality of density bands.

4. A method as claimed in claim 1, in which
   in obtaining the luminance data of a printing original, the luminance data of predetermined density bands provided on a density scale which is juxtaposed with said printing original are obtained to establish relationships between luminances and densitites, thereby to form a luminance to density conversion table, and
   the luminance data of said printing original are converted into density data in accordance with said conversion table.

5. A method as claimed in claim 4, in which
   a television camera is provided to pickup the image of a color original, and said television camera is provided with means for controlling light incident to said television camera from said color original, so that said television camera picks up the image of said color original in a plurality of density bands.

6. A method as claimed in claim 1, in which
a television camera is provided to pick up the image of a color original, and
said television camera is provided with means for controlling light incident to said television camera from said color original, so that said television camera picks up the image of said color original in a plurality of density bands.

7. A method as claimed in claim 1, in which a density distribution containing the frequency of each picture element in said image for every density range, and a density accumulation curve containing a ration of the number of picture elements in each density range to the total number of picture elements according to density levels are obtained from an image signal which is obtained by photographing said color original.

8. A method as claimed in claim 7, in which
a television camera is provided to pickup the image of a color original, and
said television camera is provided with means for controlling light incident to said television camera from said color original, so that said television camera picks up the image of said color original in a plurality of density bands.

9. A method as claimed in any one of the preceding claims, in which
luminance data which are obtained when a printing original is not set are employed as surface non-uniformity data, and
luminance data which are obtained when said printing original is set are corrected with the aid of said surface non-uniformity data.

* * * * *